US005996499A

United States Patent [19]

Gelbart et al.

[11] Patent Number: 5,996,499

[45] Date of Patent: Dec. 7, 1999

[54] ON-SITE GENERATION OF PROCESSLESS THERMAL PRINTING PLATES USING REACTIVE MATERIALS

[75] Inventors: Daniel Gelbart, Vancouver; Robert J. Mielcarski, Delta, both of Canada

[73] Assignee: Creo Products Inc., Burnaby, Canada

[21] Appl. No.: 09/226,096

[22] Filed: May 26, 1998

[51] Int. Cl.[6] ................................ B41C 1/10; G03F 7/16

[52] U.S. Cl. .......................... 101/467; 101/456; 101/457; 101/465; 430/270.1; 430/302

[58] Field of Search .................................... 101/453, 454, 101/456, 457, 462, 463.1, 467, 478; 347/2, 96, 102; 430/270.1, 302

[56] References Cited

U.S. PATENT DOCUMENTS

| | | | |
|---|---|---|---|
| 4,046,074 | 9/1977 | Hochberg et al. | 347/96 |
| 4,081,572 | 3/1978 | Pacansky | 101/467 |
| 4,634,659 | 1/1987 | Esumi et al. | 101/465 |
| 4,718,340 | 1/1988 | Love, III | 101/467 |
| 5,102,771 | 4/1992 | Vogel et al. | 430/270 |
| 5,568,173 | 10/1996 | Leenders et al. | 347/102 |
| 5,569,573 | 10/1996 | Takahashi et al. | 101/453 |

FOREIGN PATENT DOCUMENTS 0652483 5/1995 European Pat. Off. .

*Primary Examiner*—Stephen R. Funk
*Attorney, Agent, or Firm*—Oyen Wiggs Green & Mutala

[57] ABSTRACT

The traditional trade-off between performance and shelf-life of processless thermal printing plates can be eliminated by using reactive chemicals which are mixed during (or just prior to) application to the plate and imaged shortly thereafter. The utility of high power thermal exposure heads combined with the advantages of mixing two reactive chemicals, allows the generation of high performance processless thermal printing plates on-site, effectively eliminating the requirements of shelf-life and robustness. Furthermore, the process of mixing the reactive chemicals is ideally suited for on-press imaging.

18 Claims, 2 Drawing Sheets

ON-SITE GENERATION OF PROCESSLESS THERMAL PRINTING PLATES USING REACTIVE MATERIALS

RELATED APPLICATION

This invention is related to a co-owned U.S. application, Ser. No. 08/490,361 (now U.S. Pat. No. 5,713,287) which describes a method of on-press imaging using multiple cycles of coating, printing and cleaning a surface.

FIELD OF THE INVENTION

The invention relates to printing, and more specifically to on-site coating of thermal printing plates for lithographic offset printing as well as on-press imaging.

BACKGROUND OF THE INVENTION

In lithographic offset printing, printing plates are typically made of a thin aluminum sheet (the substrate) overlaid with a thin coat of polymer. The polymer is normally photo-sensitive or thermally sensitive. The sensitivity of the polymer is exploited to expose the plate with the desired image using light or laser. Photo-sensitive polymers are exposed with U.V. or visible light whereas thermally sensitive polymers are typically exposed using relatively high powered I.R. lasers. After being exposed imagewise, the plate traditionally requires chemical development before being used on a press. However, recent technologies are "processless" meaning that they require no chemical development or other intermediate steps other than possibly wiping off ablated residue and can be used directly on a press after imaging.

This invention is particularly concerned with processless plates exposed by a laser source, either in a Computer-To-Plate system (C.T.P.) or directly on the printing press (on-press imaging). The polymer coating is either hydrophobic or hydrophilic and changes its water attraction properties with exposure to the laser. Alternatively, the plate can be a dry (or waterless) offset plate. Processless plates exposed on the press may be single use or reusable (i.e. where the same plate is cleaned, re-coated with polymer and used multiple times). (See related application, Ser. No. 08/490,361, now U.S. Pat. No. 5,713,287).

Printing plate performance is typically determined by the "I.R. sensitivity" (i.e. amount of laser power required for imaging) and "imaging resolution" (i.e. the hydrophobic/hydrophilic differential between the irradiated and non-irradiated areas). At odds with plate performance are the requirements for a long shelf-life and robustness. Time combined with the stresses of handling and transport cause the performance of a printing plate to degrade. As such, the performance criteria of I.R. sensitivity and image resolution distinctly determine the required shelf-life and robustness. These conflicting goals are particularly important for processless plates, because it is extremely difficult to create a processless thermal plate combining performance criteria with shelf-life and robustness.

Pre-coated plates, also known as pre-sensitized plates, are manufactured at central locations and distributed to many users. The time between the making and the using of the plate is several months. Accordingly, the chemicals used to coat the plates must be sufficiently robust and durable to withstand transport and handling, and to endure a relatively long shelf-life (typically on the scale of twelve months). In order to achieve such a shelf-life, the chemicals employed on pre-coated plates must be relatively stable and non-reactive. As such, pre-coated plates sacrifice performance, particularly I.R. sensitivity, for robustness and shelf-life. If plates could be coated on-site at the printing plant, then this sacrifice could be effectively eliminated because the required shelf-life would only be the duration of the printing run (typically on the scale of hours or days) and there would be relatively little handling and transportation involved. Consequently, more aggressive coating chemicals, which tend to react with one another, may be used to create plates with superior I.R. sensitivity and imaging resolution at the expense of diminished shelf-life and robustness.

On-site coating has been used in the printing industry before. The best known examples are the "Wipe-On" plates in which a photo-sensitive composition is spread on the aluminum plate by hand or machine. The coated plate is then treated by mechanical, chemical or electrical processes to improve the hydrophilic properties and adhesion of the polymer coating. "Wipe-On" plates are used less frequently now, because their chemistry is the same as that of pre-coated plates, but their performance is inferior; their only advantage is lower cost. In this invention a different chemistry is used for on-site coating which cannot be used on pre-coated plates due to the strong reactive nature of the chemicals involved. The high degree of chemical activity generates plates superior to pre-coated plates at the expense of shelf-life and robustness which are of reduced importance for on-site coating.

European patent EP-0-652-483-A1, hereinafter referred to as Ellis, discloses a heat sensitive coating for use on a pre-coated processless lithographic plate. The coating consists of three chemicals:

(i) a hydrophobic polymer which reacts under the action of heat and/or acid to become hydrophilic (Page 2, lines 51–52);

(ii) a photo-thermal converter which is capable of absorbing I.R. radiation and converting it to heat and/or acid (Page 2, lines 43–44 and Page 4, lines 35–36);

(iii) a thermal acid generator which releases acid under the action of heat generated by irradiation of the photo-thermal converter (Page 5, lines 22–24).

Ellis does not teach direct addition of acid to the mixture because the Ellis invention is concerned about the detrimental effects on the shelf-life and robustness of the coating which are essential requirements of a pre-coated plate.

SUMMARY OF THE INVENTION

The present invention comprises a mixture of at least two chemicals which, when mixed together, are chemically active and have a shelf life of less than 1 month (i.e. substantially shorter than that of pre-coated plates). The high degree of chemical activity of the mixture enables the creation of a printing plate with performance properties not achievable using pre-coated plates, particularly processless pre-coated thermal plates. Due to the high chemical activity, the two (or more) chemicals are held in separate containers until the moment they are mixed together just prior to application. When the coating is accomplished by spraying, as in the preferred embodiment, the chemicals can be sprayed separately and only interact on the plate surface. Alternatively, they can be mixed in a mixing chamber just prior to spraying.

The present invention involves a direct mixture of a thermally reactive chemical, which changes it properties when irradiated, and a second chemical, which is combined with the first chemical during (or just prior to) application to the printing plate. The direct addition of the second chemical to the mixture dramatically increases the mixture's chemical reactivity, thereby increasing the I.R. sensitivity and image resolution of the plate while substantially decreasing its shelf-life and robustness. The thermally reactive chemical may be a hydrophobic polymer capable of changing its water attraction properties in the presence of heat. The second chemical may be an acidic catalyst which increases the reactivity of the polymer, thereby catalyzing the reaction that converts the polymer from a hydrophobic to a hydrophilic state.

Ellis does not disclose the direct addition of acid to the thermally reactive polymer to catalyze the polymerization reaction as taught by this invention. Instead, Ellis uses a thermal acid generator (item (iii) above) that releases acid only under the action of heat so that the Ellis coating has sufficient robustness and shelf-life to be used for pre-coated plates. In contrast to Ellis, this invention does not require the intermediate step of acid generation, and, as a result, produces a highly reactive coating with increased I.R. sensitivity and image resolution but diminished robustness and shelf-life. Accordingly, this invention is an improvement over Ellis because it discloses a method of coating a lithographic surface on-site which is capable of achieving a superior image.

Ellis is just one of the many known compositions for processless thermal printing plates which could benefit from the present invention. The invention is not limited to any particular formulation.

Further decreasing the required shelf-life and robustness of the plate coating, allows increasingly superior I.R. sensitivity and imaging resolution because even more reactive chemicals can be employed. For this reason, the greatest potential for the invention is on-press imaging of a polymer layer spread on top of a reusable surface. On-press imaging applications require the minimum shelf-life (down to a few minutes) and robustness enabling the use of the most reactive chemicals for plate coating and, thus, achievement of the highest possible performance. Furthermore, on-site plate generation cuts costs and enables the re-use of plates by washing off the old coat.

BRIEF DESCRIPTION OF THE DRAWINGS

The novel features believed characteristic of the invention are set forth in the appended claims. The invention itself, however, as well as other features and advantages thereof, will be best understood by reference to the description which follows, read in conjunction with the accompanying drawings, wherein:

FIG. 1-*b* schematically depicts a method of application of the two chemicals to a printing plate, where the chemicals are mixed immediately prior to application to the surface.

DESCRIPTION OF THE PREFERRED EMBODIMENT

Figure 1A:
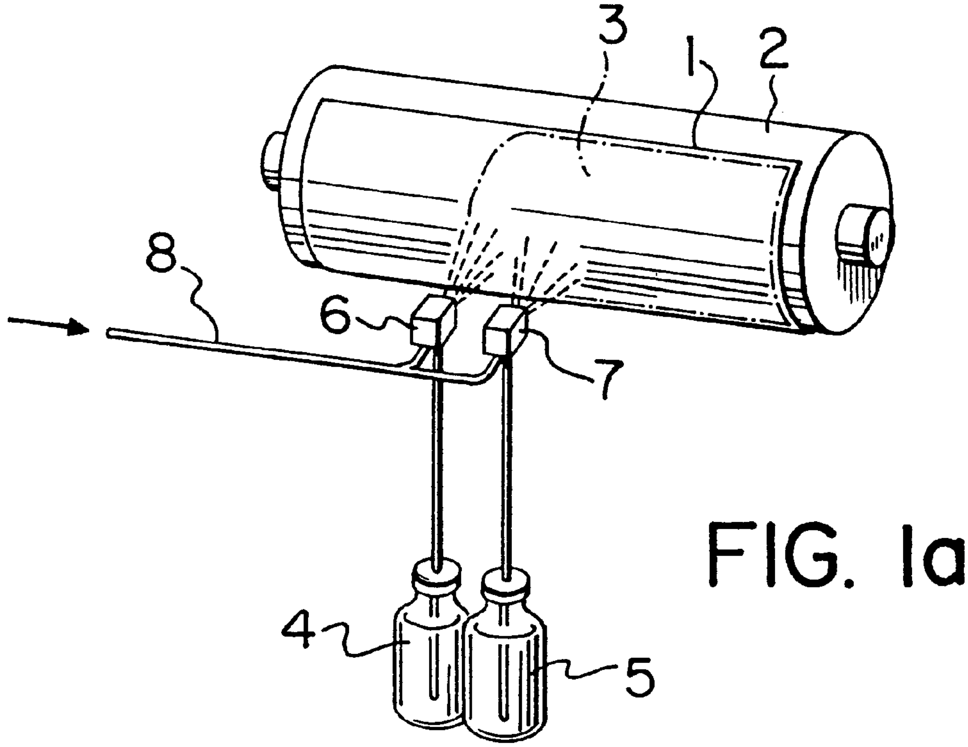
FIG. 1-*a* schematically depicts a method of application of the two chemicals to a printing plate, where the chemicals are mixed during application to the surface.
Figure 1B:
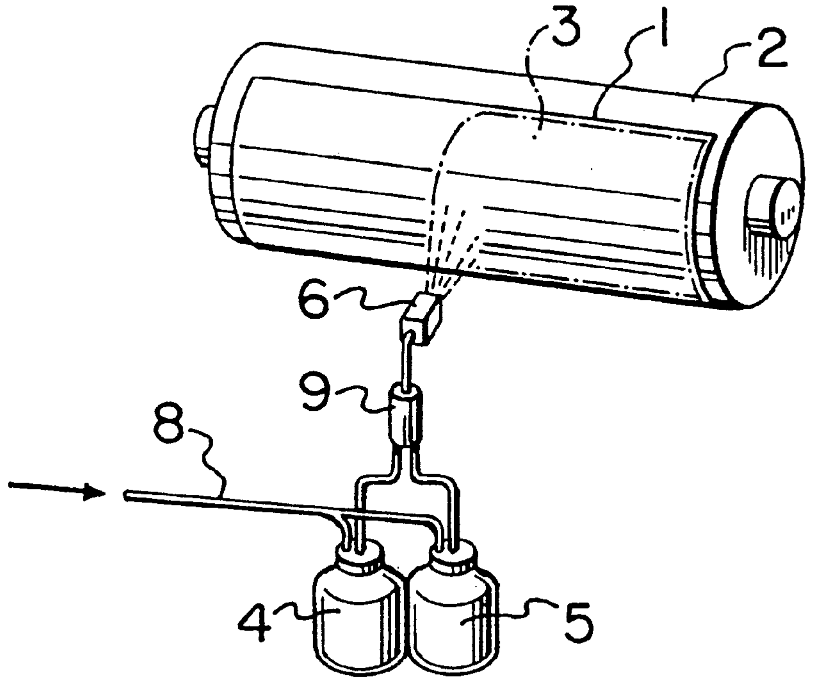

Referring now to FIG. 1-*a* and FIG. 1-*b*, a lithographic printing surface 1, which can be a printing plate or a reusable printing cylinder, is mounted on cylinder 2 and coated with a coating 3, which is made up by mixing material A, stored in container 4, with material B, stored in container 5. In the preferred embodiment, material A is a thermally reactive polymer which changes its water attraction properties when heated with a laser, while material B is an accelerator, or catalyst to the process. One of the two materials also contains a laser absorbing dye matched to the wavelength of the laser which will, subsequently be used to imagewise expose printing surface 1. The process of creating the image on the polymer is well known and will not be discussed here. The materials A and B are sprayed using spray nozzles 6 and 7 powered by air supply 8. The suction action of the spray nozzles 6 and 7 pulls up the materials from containers 4 and 5. FIG. 1-*b* shows an alternative embodiment in which the materials are pre-mixed in mixing chamber 9 before being applied to a single sprayer 6. In FIG. 1-*b*, air pressure from air supply 8 is used to force the materials A and B into mixing chamber 9.

Figure 2:
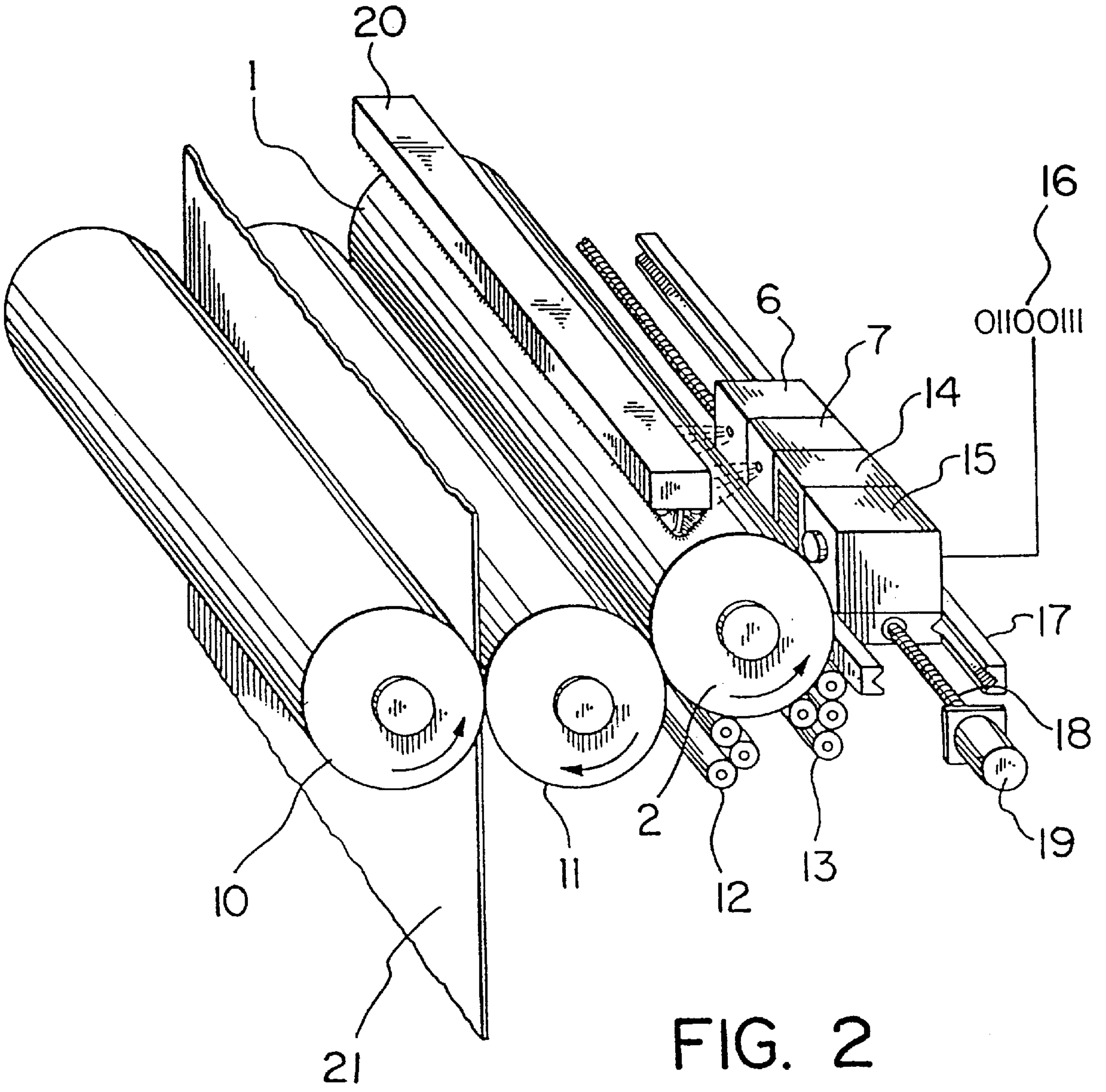
FIG. 2 shows the co-spraying of two reactive chemicals for an on-press imaging application.

Referring now to FIG. 2, the preferred embodiment is an on-press imaging system for a reusable printing surface incorporated into a lithographic offset printing press. Only minimal details of the printing press are shown, as the art of lithographic printing presses as well as on-press imaging systems is well known. A sheet of paper 21 is moving between an impression cylinder 10 and a blanket cylinder 11. A cylinder 2 carries a printing surface 1 which picks up ink imagewise by the action of dampening rollers 12, which apply a fountain solution, and inking rollers 13, which apply ink. For a waterless offset, rollers 12 are not used. Printing surface 1 can be cleaned by an automated cleaner 20 which is very similar to automated blanket cleaners. The cleaning is performed after each print run, prior to re-coating. Two spray units, 6 and 7, are mounted together with drying unit 14 and imaging head 15. Imaging head 15 is supplied with image data 16 from a computer system (not shown). The assembly of parts 6, 7, 14 and 15 can cross over the full width of cylinder 2 using tracks 17 and leadscrew 18, driven by motor 19. The coating and imaging is done in a spiral fashion, with spray covering a much wider area than the imaging swath. Thus, the spray coats overlap. The overlapping of the spray promotes uniformity. Further details of this on-press imaging concept are covered by co-owned application Ser. No. 08/490,361 (now U.S. Pat. No. 5,713,287).

By way of example, a thermal coating suitable for this application is disclosed by Ellis in Example 4 of European Patent EP-0-652-483-A1. The Ellis coating is described below. The preparation of the copolymer is described on page 6, lines 31–39.

Preparation of THPM-MPTS Copolymer

A solution of 100 g tetrahydropyan-2-yl methacrylate (THPM), 10 g methacryloxypropyltrimethoxysilane (MPTS) and 1.93 g of azobisisobutyronitrile (AIBN) in 100 $cm^3$ of MEK [methyl-ehtyl-ketone] was heated for four hours. To the reaction mixture was added 583 $cm^3$ of MEK to give a solution of the copolymer at 17 weight % solids. To a 100 $cm^3$ portion of this solution was added a further 100 $cm^3$ of MEK. This mixture was then poured into 1L of methanol to precipitate the copolymer. The white solid was collected to give 23.3 g of the pure copolymer.

Any of the well known I.R. absorbing dyes may be suitable for mixture with the copolymer described above. The Ellis dye D-1 is a suitable example. Dyes with the following nucleus are described in Ellis page 4, line 35 to page 5 line 21.

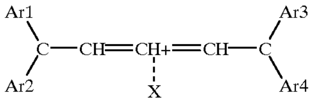

Ar1 to Ar4 are aryl groups which may be the same or different such that at least two of Ar1 to Ar4 have a tertiary amino group in the 4-position, and X is an anion. Examples of the tertiary amino groups include dialkylamino groups, diarylamino groups, and cyclic substituents such as pyrrolidino, morpholino, piperidino, etc. The tertiary amino group may form part of a fused ring system, e.g. one or more of Ar1 to Ar4 may represent a juliolidine group.

Preferably the anion X is derived from a strong acid (e.g. HX should have a pKa of less than 3, preferably less than 1). Suitable identities for X include $ClO_4$, $BF_4$, $CF_3SO_3$, $PF_6$, $AsF_6$, $SbF_6$, etc. Such dyes are believed to form the acid HX on irradiation, and the effect appears to be particularly strong when not all of Ar1 to Ar4 are identical. Preferred dyes [for the above formula] include the following:

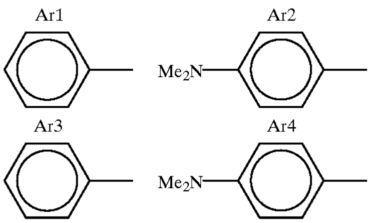

As described in Ellis page 7, lines 19–20, a solution was formed of the copolymer (0.35g), dye D-1 (0.0365 g) in 2-butanone (5g). This solution is hereinafter referred to as that of Ellis example 4.

This coating, and similar coatings cited in the Ellis application, were developed for pre-coated processless thermal plates. Consequently, the performance criteria (I.R. sensitivity and imaging resolution) were compromised order to achieve a coating with the robustness and shelf-life required of pre-coated plates. The performance of the Ellis formulation, and in particular, the formulation cited in example 4 of the Ellis patent, can be greatly enhanced by using a small amount of a stronger organic acid such as polysulfonic acid in the polymer. As polysulfonic acid is a relatively reactive material, the shelf life of the coated plate is reduced from many months to a few days. For on-site plate preparation and on-press imaging, however, this reduced shelf life is sufficient. Using the composition of Ellis example 4 in container 4 and polysulfonic acid in container 5, a printing surface with much stronger ink/water differentiation (i.e. imaging resolution) was achieved. The amount of polysulfonic acid ranges from 1% to 20% by weight of the Ellis example 4 solution. An alkaline fountain solution must be used in the printing process. Best results were obtained with a fountain solution containing 1% by weight of potassium hydroxide and 2% by weight of isopropyl alcohol. The coating was about 1 micron in thickness and the imaging was done in a TRENDSETTER™ 3422T, made by Creo Products (Burnaby, B. C., Canada). Imaging was done at 2400 dpi with an energy of 300 $mJ/cm^2$. Print tests on a Heidelberg GTO offset press showed a marked improvement of the press latitude and speed of achieving ink/water balance when the polysulfonic acid was introduced. Clearly, other chemical systems can achieve similar performance benefits by compromising robustness and shelf-life. For example a simple non-reactive catalyst can be introduced by the second spray nozzle instead of a reactive acid.

What is claimed is:

1. A method of on-site preparation of a lithographic printing surface, the method comprising:
   (a) applying to said lithographic printing surface a coating of a substance having a shelf-life of one month or less, the substance comprising:
      (i) a first thermally reactive chemical which, when imaged via exposure to infra-red radiation, changes its affinity to at least one of ink and water;
      (ii) a second chemical which, when mixed with said first thermally reactive chemical, increases infra-red sensitivity of said substance; and
   (b) exposing imagewise said lithographic printing surface with infra-red radiation within one month of application of said coating;
   wherein said first and second chemicals are mixed less than one month prior to said applying; and
   wherein said surface forms a processless thermal printing plate requiring no chemical development, which plate can be used directly on-press after said exposing.

2. A method according to claim 1, including mixing said first thermally reactive chemical and said second chemical by applying said coating to said lithographic printing surface with an overlapping spray from two separate spray nozzles.

3. A method according to claim 1, including mixing said first thermally reactive chemical and said second chemical immediately prior to applying said coating to said lithographic printing surface via a spray nozzle.

4. A method according to claim 1, wherein said printing surface is a plate cylinder in a lithographic offset press.

5. A method according to claim 1, wherein said coating is removed and a new coating applied after each use.

6. A method according to claim 1, wherein said first thermally reactive chemical is a polymer having a water response property which is one of hydrophobic and hydrophilic and convertible to an opposite water responsive property to said one of hydrophobic and hydrophilic in response to exposure to infra-red radiation.

7. A method according to claim 1, wherein said second chemical contains an activator which increases the rate of polymerization.

8. A method according to claim 7, wherein said activator is an organic acid.

9. A method according to claim 8, wherein said organic acid is polysulfonic acid.

10. A method according to claim 1, including mixing said separate chemicals immediately prior to applying said coating to said lithographic surface.

11. A method of on-site preparation of a lithographic printing surface, the method comprising:
   (a) applying to said lithographic printing surface a coating of a thermally reactive substance comprising at least two separate chemicals, said chemicals being kept separately prior to application and mixing said separate chemicals by applying the separate chemicals in overlapping coatings, mixing taking place on said lithographic printing surface;
   (b) exposing imagewise said lithographic printing surface with infra-red radiation within one month of application of said coating;
   wherein said surface forms a processless thermal printing plate requiring no chemical development, which plate can be used directly on-press after said exposing.

12. A method according to claim 11, wherein said lithographic printing surface is a plate cylinder in a lithographic offset press.

13. A method according to claim 11, wherein said coating is removed and a new coating applied after each use.

14. A method of on-site preparation of a lithographic printing surface, the method comprising:

(a) applying to the lithographic printing surface a coating of a substance comprising:

(i) a first thermally reactive chemical which, when imaged via exposure to infra-red radiation, changes its affinity to at least one of ink and water; and, (ii) a second chemical which, when mixed with the first thermally reactive chemical, increases infra-red sensitivity of the substance; and, (b) exposing imagewise the lithographic printing surface with infra-red radiation within one month of application of the coating;

wherein the first thermally reactive chemical and the second chemical are mixed during the application of the coating to the lithographic printing surface by applying overlapping spray from two separate spray nozzles and wherein the surface forms a processless thermal printing plate requiring no chemical development, which plate may be used directly on-press after the exposing step.

15. The method of claim 14 wherein the second chemical is a chemical which increases imaging resolution of the substance.

16. A method of on-site preparation of a lithographic printing surface, the method comprising:

(a) applying to the lithographic printing surface a coating of a substance comprising:

(i) a first thermally reactive chemical which, when imaged via exposure to infra-red radiation, changes its affinity to at least one of ink and water; and, (ii) a second chemical containing polysulfonic acid which, when mixed with the first thermally reactive chemical, increases a rate of polymerization and infra-red sensitivity of the substance; and, (b) exposing imagewise the lithographic printing surface with infra-red radiation within one month of application of the coating;

wherein the surface forms a processless thermal printing plate requiring no chemical development, which plate may be used directly on-press after the exposing step.

17. The method of claim 16 wherein the first thermally reactive chemical is a polymer having a water response property which is one of hydrophobic and hydrophilic and the water response property is convertible to an opposite water response property which is one of hydrophilic and hydrophobic in response to exposure to infra-red radiation.

18. The method of claim 17 wherein the polysulfonic acid is provided in a proportional amount of 1% to 20% by weight of the polymer in the first thermally reactive chemical.

* * * * *